(12) United States Patent
Efferenn et al.

(10) Patent No.: US 6,716,720 B2
(45) Date of Patent: Apr. 6, 2004

(54) METHOD FOR FILLING DEPRESSIONS ON A SEMICONDUCTOR WAFER

(75) Inventors: Dirk Efferenn, Dresden (DE); Hans-Peter Moll, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/378,244

(22) Filed: Mar. 3, 2003

(65) Prior Publication Data

US 2003/0166327 A1 Sep. 4, 2003

(30) Foreign Application Priority Data

Mar. 2, 2002 (DE) .......................... 102 09 334

(51) Int. Cl.[7] ...................... H01L 21/762; H01L 21/311
(52) U.S. Cl. ...................... 438/424; 438/437; 438/697; 438/705
(58) Field of Search ................... 438/424, 437, 438/697, 705, FOR 103, 759, FOR 267, FOR 388

(56) References Cited

U.S. PATENT DOCUMENTS

| 4,934,190 | A | * | 6/1990 | Lee .......................... 73/204.26 |
| 5,314,843 | A | * | 5/1994 | Yu et al. .................... 438/692 |
| 5,403,435 | A | * | 4/1995 | Cathey et al. ............... 438/669 |
| 5,413,953 | A | * | 5/1995 | Chien et al. ................. 438/443 |
| 5,488,001 | A | * | 1/1996 | Brotherton ................... 438/164 |
| 5,825,050 | A | * | 10/1998 | Hirakawa ..................... 257/57 |
| 6,100,160 | A | | 8/2000 | Hames |
| 6,121,149 | A | * | 9/2000 | Lukanc et al. ............... 438/692 |
| 6,197,697 | B1 | * | 3/2001 | Simpson et al. ............. 438/705 |
| 6,214,749 | B1 | | 4/2001 | Watanabe et al. |
| 6,294,481 | B1 | | 9/2001 | Inumiya et al. |
| 6,365,525 | B2 | * | 4/2002 | Muller ........................ 438/705 |
| 6,486,074 | B1 | * | 11/2002 | Rolfson ...................... 438/725 |
| 6,503,841 | B1 | * | 1/2003 | Criscuolo et al. ........... 438/705 |
| 2002/0009855 | A1 | | 1/2002 | Kim |
| 2002/0045336 | A1 | * | 4/2002 | Locati et al. ................ 438/627 |
| 2002/0052086 | A1 | * | 5/2002 | Maeda ........................ 438/283 |
| 2002/0068443 | A1 | * | 6/2002 | Eimori ........................ 438/639 |
| 2002/0123181 | A1 | * | 9/2002 | Hachisuka ................... 438/197 |
| 2002/0130374 | A1 | * | 9/2002 | Ueno et al. .................. 257/392 |

FOREIGN PATENT DOCUMENTS

JP 59086263 A 5/1984

OTHER PUBLICATIONS

Ogura, T. et al.: "A Shallow Trench Isolation with SiN Guard–Ring for Sub–Quarter Micron CMOS Technologies", Silicon Systems Research Laboratories, NEC Corporation. pp. 2, date unknown.

* cited by examiner

*Primary Examiner*—George Fourson
(74) *Attorney, Agent, or Firm*—Laurence A. Greenberg; Werner H. Stemer; Gregory L. Mayback

(57) ABSTRACT

A method is disclosed for filling a depression between two vertically adjoining semiconductor layers, in particular an edge depression arising in the context of an isolation trench formation. A covering layer, preferably made of silicon oxide, is deposited in a large-area manner and is then doped with doping material, preferably nitrogen, essentially right over the entire depth of the layer. The doping material provides for an increased rate of removal of the covering layer, so that, after the removal process, the covering layer material only remains in the depressions.

9 Claims, 2 Drawing Sheets

METHOD FOR FILLING DEPRESSIONS ON A SEMICONDUCTOR WAFER

BACKGROUND OF THE INVENTION

Field of the Invention

The invention relates to a method for filling a depression between two vertically adjoining semiconductor layers, in particular for filling edge depressions that form during a lateral isolation of adjacent transistors or other active regions by using trenches that are etched into the semiconductor substrate and filled with an insulating material.

Planar technology is usually used during the lateral patterning of semiconductor wafers in the context of forming integrated circuits. Planar technology includes a sequence of individual processes which each act on the whole area of the wafer surface and, by using suitable masking layers, lead to the local alteration of the semiconductor material in a targeted manner. During the lateral patterning of a semiconductor wafer, the procedure is usually such that trenches are etched into the semiconductor substrate using a mask layer and are then filled with a corresponding material. In particular when filling narrow trenches, the filling material is deposited in a large-area manner and is subsequently removed as far as the wafer surface by using a removal process, thereby producing essentially a plane surface over the entire semiconductor wafer. However, during this removal process, depressions usually arise in the edge region of the plane surface at the transition between the semiconductor layers that are arranged vertically one beside the other. The depressions principally arise due to the fact that, during the process of filling the trenches, stresses are produced at the interfaces between the semiconductor layers and, during the subsequent removal process and subsequent etching processes, these stresses lead to increased rates of removal and etching rates, respectively, in this boundary region, as a result of which depressions form at the transition between the vertical semiconductor layers.

Such edge depressions also arise, in particular, during the formation of trench isolations for laterally isolating closely adjacent active regions in the context of very large scale integration technology. In trench isolation technology, the procedure is such that trenches are etched into the semiconductor substrate between the active regions, e.g. using a nitride mask, and, after a short thermal oxidation, oxide is deposited conformally in order to fill the trenches and the surface is subsequently uncovered by etching back the deposited oxide layer or by chemical mechanical polishing. This method makes it possible to produce field oxides in very narrow interspaces having a width of less than 100 nm. However, at the edge between the field oxide trenches and the active regions, depressions often arise during the etching-back or chemical mechanical polishing process, which depressions can lead to undesirable electrical effects in the integrated circuit formed on the semiconductor wafer.

There is thus the risk that, during the subsequent production of gate layers for forming field-effect transistors on the active regions, short circuits to the adjacent transistor can occur on account of gate material residues which remain during the process sequence. Furthermore, in the depressions, parasitic transistors with a low threshold voltage may form in the edge region of the gate electrodes, so-called "corner devices" which lead to increased leakage currents. In order to avoid depressions in the edge region between the field oxide trenches and the active regions, an elevated field oxide level compared with the active regions is therefore produced in the trench regions in the context of the etching-back or chemical mechanical polishing processes. However, the resulting step leads to an impaired conformity of the subsequent coating on account of the step being covered incompletely, as a result of which the electrical function of the deposited layer is adversely effected. In particular when fabricating extremely small structures, it is necessary, therefore, to fabricate essentially plane surfaces for the coating processes.

An article by T. Ogura et al. "A Shallow Trench Isolation with SiN Guard-Ring for Sub-Quarter Micron CMOS Technologies" presents a trench isolation technique in which the field oxide filling is surrounded by a guard ring made of SiN in order to fill edge depressions and, at the same time, to avoid the risk of corner devices arising. However, the production of an SiN guard ring requires an additional expensive lithography process sequence and, moreover, additionally presupposes a minimum step height.

SUMMARY OF THE INVENTION

It is accordingly an object of the invention to provide a method for filling depressions between two vertically adjoining semiconductor layers, in particular, edge depressions that form in the context of trench isolation technology, which overcomes the above-mentioned disadvantages of the prior art methods of this general type.

It is an object of the invention to provide a method that can be used to fill such depressions in a simple manner whilst avoiding steps at the edges.

With the foregoing and other objects in view there is provided, in accordance with the invention, a method for filling a depression between two vertically adjoining semiconductor layers. The method includes: forming two vertically adjoining semiconductor layers on a semiconductor wafer, the two semiconductor layers being made of different materials and an edge depression forming near a transition between the two semiconductor layers; in a large-area manner, applying an essentially uniform covering layer having a predetermined layer thickness above the two semiconductor layers to cover the two semiconductor layers and the edge depression lying between the two semiconductor layers; increasing a rate at which the covering layer can be subsequently removed by introducing a doping material into the covering layer essentially down to a depth corresponding to the layer thickness of the covering layer; and removing the covering layer with the doping material such that undoped covering layer material remains in the edge depression.

In accordance with an added feature of the invention, the covering layer is provided as an electrically neutral material.

In accordance with an additional feature of the invention, an electrically neutral material is used as the doping material.

In accordance with another feature of the invention, the step of introducing the doping material into the covering layer loosens a structure of the covering layer.

In accordance with a further feature of the invention, the material of one of the two semiconductor layers is used as material for the covering layer.

In accordance with a further added feature of the invention, the step of forming the two semiconductor layers is performed by: patterning a mask layer on the semiconductor wafer to define a trench region; forming a trench in the semiconductor wafer; in a large-area manner, applying an oxide layer to fill the trench; removing the oxide layer to uncover the mask layer; and removing the mask layer.

In accordance with a further additional feature of the invention, the step of applying the covering layer includes forming an oxide layer as the covering layer.

In accordance with yet an added feature of the invention, nitrogen is used as the doping material.

In accordance with yet an additional feature of the invention, the oxide layer has a layer thickness of approximately 25 nm and the nitrogen is implanted with an energy of 8 keV.

According to the invention, in order to fill a depression which forms between two vertically adjoining semiconductor layers made of different materials, an essentially uniform covering layer having a predetermined layer thickness is applied in a large-area manner over the two semiconductor layers to cover the depression. A doping material is then introduced into the covering layer, essentially down to a depth that corresponds to the layer thickness. The doping material provides for an increased rate of removal of the covering layer. Afterward, the covering layer with the doping material is then removed. The inventive process of filling depressions by using different rates of removal which result from the introduction of doping material into a covering layer is distinguished by a simple process sequence with a high degree of process control. The processes are essentially all performed in a large-area manner and thus cost-effectively on the wafer surface. Furthermore, doping material can be introduced into a covering layer easily and reliably with a precisely defined depth, which ensures that an exact doping boundary and thus a precise etching stop can be defined in the covering layer above the depression.

In accordance with one preferred embodiment, the material of one of the two semiconductor layers that adjoin one another laterally is used as material for the covering layer. This ensures that the material in the depression has the same properties as one of the two adjacent semiconductor layers and, consequently, the electrical properties are not influenced in an undesirable manner by the depression filling, in particular during the subsequent formation of integrated circuits on the semiconductor wafer.

In accordance with a further preferred embodiment, an electrically neutral material is set up both for the covering layer material and/or the doping material for changing the rate of removal in the covering layer material, in order to prevent changes to the electrical properties by the depression filling.

In accordance with a further preferred embodiment, the depression filling process is used to form a trench isolation, an oxide layer being used as covering layer material. This design reliably prevents the production of a parasitic transistor with a low threshold voltage at the edge of an active region which would lead to increased leakage currents. Nitrogen is preferably used as doping material for the oxide covering layer. The oxide layer preferably has a layer thickness of 25 nm and the nitrogen is implanted with an energy of 8 keV. This design makes it possible to carry out an optimal depression filling in the context of a trench isolation process.

Other features which are considered as characteristic for the invention are set forth in the appended claims.

Although the invention is illustrated and described herein as embodied in a filling method for depressions on a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention is explained with reference to a process sequence for trench isolation between two active regions in a silicon substrate. However, the depression filling technique illustrated can be used for leveling arbitrary depressions between lateral structures in a semiconductor substrate.

The embodiment is explained with reference to FIGS. 1A–1K which diagrammatically illustrate cross sectional views taken through a portion of a silicon wafer after successive individual process steps.

Figure 1A:
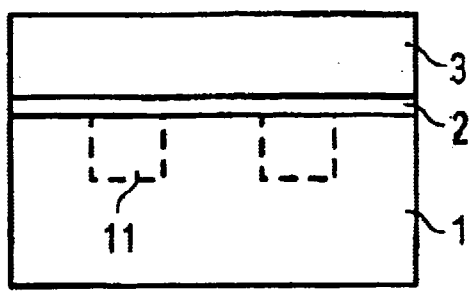
FIGS. 1A–1K diagrammatically show a process sequence for forming a trench isolation in a silicon substrate.

Referring now to the figures of the drawing in detail and first, particularly, to FIG. 1A thereof, there is shown a silicon wafer 1, in which a trench isolation between two active regions 11 is produced using a sequence of process steps known per se. Conductive structures (not shown) have been formed in the active regions 11 before the formation— illustrated below—of a trench isolation in the context of planar technology. The trench isolation between the active regions 11 is formed using planar technology known per se. For this purpose, in a first step, preferably after removing contaminants on the wafer surface, e.g. $SiO_2$ etching, an $SiO_2$ layer 2 is produced, preferably thermally, on which, in turn, an $Si_3N_4$ layer 3 is deposited, which serves as a masking layer for a trench etching. FIG. 1A shows a cross section through the silicon wafer 1 after the deposition of the $Si_3N_4$ layer 3.

The isolation trench structure is defined on the $Si_3N_4$ layer 3, preferably using lithography technology known per se. For this purpose, a light-sensitive photoresist 4 is deposited in a large-area manner on the $Si_3N_4$ layer 3 and is subsequently exposed using a mask with the structure of the trench isolation. The photoresist layer 4 is then developed and the exposed photoresist layer is removed. As an alternative to such a positive resist technique, however, it is also possible to use a negative resist technique, in the case of which the unexposed photoresist locations are then removed. FIG. 1B shows a cross section through the silicon wafer 1 after patterning the photoresist layer 4.

After the photolithography process, an anisotropic etching of the $Si_3N_4$ layer 3 and of the underlying $SiO_2$ layer 2 is carried out in order to produce an etching mask for the isolation trench. A further anisotropic silicon etching is then performed using the photoresist-$Si_3N_4$—$SiO_2$ layer sequence as an etching mask, in order to produce the isolation trench. FIG. 1C shows a cross section through the silicon wafer 1 after the last process step described. An isolation trench 5 has been formed between the active regions 11 in the silicon wafer 1.

Figure 1D:
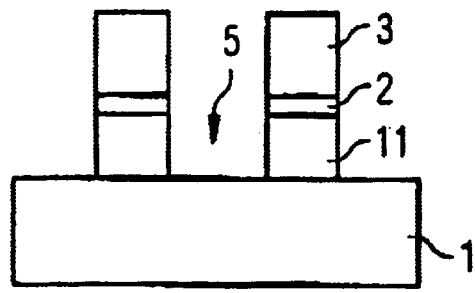
Figure 1B:
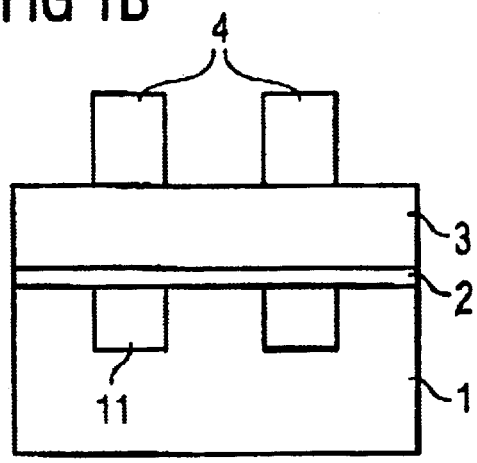
Figure 1E:
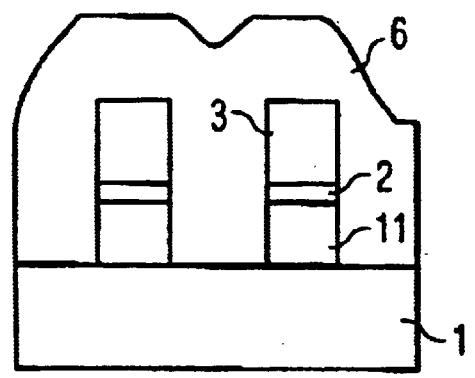
Figure 1C:
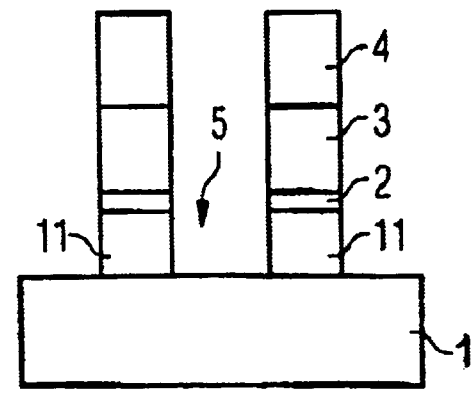

The isolation trench etching is followed by a further etching for removing the photoresist layer 4, as is shown in FIG. 1D. An $SiO_2$ layer 6 is subsequently deposited conformally over the entire wafer surface. In this case, the $SiO_2$ deposition is preferably effected using the CVD (Chemical Vapor Deposition) method. Besides CVD deposition, however, it is also possible to use other methods, e.g. sputtering methods, for producing $SiO_2$. In the case of CVD deposition, use is preferably made of those methods that provide for an electrically stable, dense $SiO_2$ layer, such as e.g. the TEOS (tetraethylorthosilicate) or HDP (High Density Plasma) method. FIG. 1E shows a cross section through the silicon wafer after the conformal deposition of the $SiO_2$ layer 6. As an alternative to an $SiO_2$ layer, however, it is also possible to effect a trench filling with a polysilicon layer.

Figure 1F:
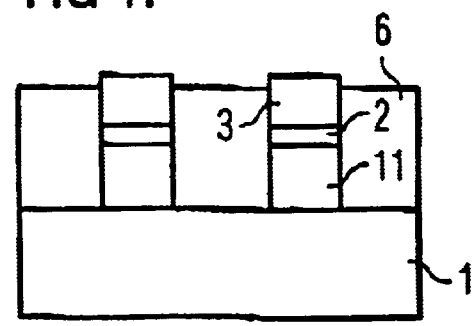

After filling the trench with the $SiO_2$ layer 6, which serves for isolating the two electrically active regions 11 on the silicon wafer 1, the $SiO_2$ layer 6 applied in a large-area manner is removed in the region of the active regions 11 above the $Si_3N_4$ layer 3. The removal process used is preferably chemical mechanical polishing, during which the $SiO_2$ layer is polished away at the projecting locations using a rotating polishing wheel and polishing agent until an essentially plane surface, as is shown in FIG. 1F, is produced.

Figure 1G:
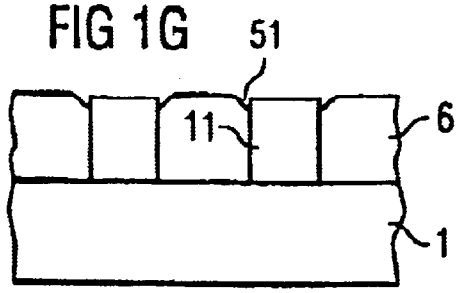

After leveling the $SiO_2$ layer 6, in a subsequent etching process, the $Si_3N_4$ layer 3 is removed above the active regions 11 on the silicon wafer and, at the same time, the $SiO_2$ filling layer 6 is etched back to the level of the wafer surface. A cross section through the silicon wafer after this removal process is shown in FIG. 1G. In this case, the removal process is preferably controlled in such a way that the $SiO_2$ layer 6 is essentially plane with the adjoining silicon surface, or protrudes only a little, so that a step which could impair subsequent patterning processes is essentially avoided.

Figure 1H:
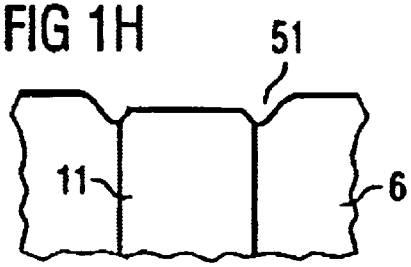

However, during the removal process, depressions 51 arise, as shown more precisely by the detailed view in FIG. 1H, at the transition region between the silicon surface and the adjoining $SiO_2$ layer 6 for filling the isolation trench 5, in particular on account of a different etching behavior of the $SiO_2$ layer 6 in this edge region. In these depressions 51, undesirable parasitic transistors, so-called "corner devices", which lead to increased leakage currents, can then arise during the subsequent patterning processes. Moreover, there is the risk of gate material residues remaining in the depressions 51 during the subsequent fabrication of transistor structures, which residues can lead to short circuits between adjacent transistors.

Figure 1I:
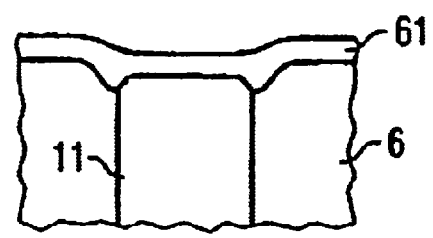

In order to fill the depressions 51, according to the invention a thin $SiO_2$ layer 61, preferably having a thickness of 25 nm, is deposited in a large-area manner on the wafer surface. In particular, the depressions 51 between the active regions 11 of the silicon wafer 1 and the $SiO_2$ trench fillings 6 are also covered. A cross section through the silicon wafer in accordance with the detailed view shown in FIG. 1H after this deposition process is shown in FIG. 1I. In this case, the oxide deposition is preferably effected according to the same method as the filling of the isolation trench 5, in order to obtain a thin, electrically stable and dense $SiO_2$ layer. Therefore, once again the TEOS or HDP method is preferably used. As an alternative to applying the $SiO_2$ layer, it is also possible to apply a covering layer made of a different insulating material.

Figure 1J:
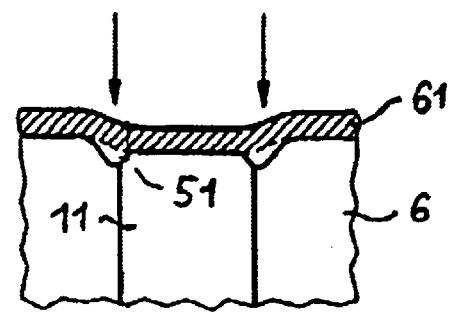

The large-area deposition of the $SiO_2$ layer 61 is followed by an introduction of a doping material into the $SiO_2$ covering layer with a uniform depth essentially corresponding to the layer thickness of the covering layer 61. In this case, the introduction of the doping material is controlled in such a way that no doping material penetrates into the depressions 51. Nitrogen is preferably used as the doping material, and is implanted with an energy of 8 keV for a layer thickness of 25 nm. The doping profile thus to be attained, in the case of which the depressions 51 remain free of doping material, is shown in FIG. 1J.

Figure 1K:
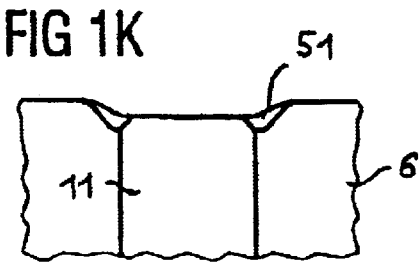

After this doping step, in a concluding step, the $SiO_2$ layer 61 is removed again in the regions doped with nitrogen, so that the $SiO_2$ layer 61 remains exclusively in the depression region 51, as is illustrated in FIG. 1K. An etching method is preferably used as the layer removal method. DHS in a dilution ratio of 200 to 1 is used as the etching chemical. By introducing the nitrogen doping into the $SiO_2$ layer 61, the etching rate is increased by approximately a factor of 2.5 in this region, thereby enabling a precise control of the etching process and thus an exact etching stop before the $SiO_2$ layer 61 is attacked in the depressions 51 by the etching chemical. As an alternative to the use of nitrogen, any other doping materials which lead to an increased etching rate of the $SiO_2$ layer 61 can also be used. In this case, the doping materials used are preferably those substances which increase the etching rate by loosening the density of the $SiO_2$ layer 61 during the doping process. The doping materials used are preferably electrically neutral elements and molecules, in particular noble gases such as argon and fluorine. The doping methods used may be not only implantation but also other known doping methods. During the doping implantation, the implantation energy and the particle current density are adapted to the desired penetration depth in the covering layer.

The inventive depression filling method makes it possible to level depressions between vertical semiconductor layers in a simple manner, in which case the depression filling may preferably be composed of the same material as one of the two lateral semiconductor layers, in order to prevent any undesired influence on the electrical and mechanical properties.

It lies within the scope of the invention, over and above the exemplary embodiment mentioned above, to modify the specified dimensions, concentrations, materials and processes in a suitable manner in order to fabricate the inventive depression filling. In particular, it is possible to use all known planar techniques for forming the layers. The features of the invention that are disclosed in the description above and the drawings may be of importance both individually and in any desired combination for realizing different configurations of the invention.

We claim:

1. A method for filling a depression between two vertically adjoining semiconductor layers, the method which comprises:

forming two vertically adjoining semiconductor layers on a semiconductor wafer, the two semiconductor layers being made of different materials and an edge depression forming near a transition between the two semiconductor layers;

in a large-area manner, applying an essentially uniform covering layer having a predetermined layer thickness above the two semiconductor layers to cover the two semiconductor layers and the edge depression lying between the two semiconductor layers;

increasing a rate at which the covering layer can be subsequently removed by introducing a doping material into the covering layer essentially down to a depth corresponding to the layer thickness of the covering layer; and removing the covering layer with the doping material such that undoped covering layer material remains in the edge depression.

2. The method according to claim 1, which comprises providing the covering layer as an electrically neutral material.

3. The method according to claim 1, which comprises using an electrically neutral material as the doping material.

4. The method according to claim 1, wherein the step of introducing the doping material into the covering layer loosens a structure of the covering layer.

5. The method according to claim 1, which comprises using material of one of the two semiconductor layers as material for the covering layer.

6. The method according to claim 1, which comprises performing the step of forming the two semiconductor layers by:

patterning a mask layer on the semiconductor wafer to define a trench region;

forming a trench in the semiconductor wafer;

in a large-area manner, applying an oxide layer to fill the trench;

removing the oxide layer to uncover the mask layer; and removing the mask layer.

7. The method according to claim 6, wherein the step of applying the covering layer includes forming an oxide layer as the covering layer.

8. The method according to claim 7, which comprises using nitrogen as the doping material.

9. The method according to claim 8, wherein the oxide layer has a layer thickness of approximately 25 nm and the nitrogen is implanted with an energy of 8 keV.

* * * * *